United States Patent [19]

Hibdon et al.

[11] Patent Number: 5,486,766
[45] Date of Patent: Jan. 23, 1996

[54] METHOD FOR TESTING SWITCH MATRICES

[75] Inventors: Gregory B. Hibdon, Folsom; John M. Ingram, Sacramento, both of Calif.

[73] Assignee: Intel Corporation, Santa Clara, Calif.

[21] Appl. No.: 246,997

[22] Filed: May 20, 1994

[51] Int. Cl.⁶ .................................................... G01R 31/02
[52] U.S. Cl. ........................ 324/537; 324/538; 324/73.1
[58] Field of Search ................................ 324/73.1, 158.1, 324/537, 538; 371/21.1, 21.6, 22.2, 20.1

[56] References Cited

U.S. PATENT DOCUMENTS

| | | | |
|---|---|---|---|
| 4,587,481 | 5/1986 | Lischke et al. | 324/538 X |
| 5,057,775 | 10/1991 | Hall | 324/73.1 X |
| 5,065,090 | 11/1991 | Gheewala et al. | 324/73.1 X |
| 5,083,083 | 1/1992 | El-Ayat et al. | 324/538 |
| 5,202,624 | 4/1993 | Gheewala et al. | 324/73.1 |
| 5,309,091 | 5/1994 | El-Ayat et al. | 324/158.1 |

Primary Examiner—Maura K. Regan
Assistant Examiner—Diep Do
Attorney, Agent, or Firm—Blakely, Sokoloff, Taylor & Zafman

[57] ABSTRACT

A testing method for connecting a first group of input conductors to output conductors in which the number of switching devices connected to each output conductor at connections with the group of input conductors are summed individually, the output conductor having the least number of switching devices at these intersections is chosen, and the switching devices are summed for each of the group of input conductors having a switching device at an intersection with the chosen output conductor and the input conductor having the least number of switching devices is selected. A switching device at the intersection of this first selected input conductor and the first selected output conductor is chosen for closure to provide the first connection in the output combination desired. The process is repeated until all of the connections are chosen or one fails.

10 Claims, 4 Drawing Sheets

Figure 4

| | C1 | C2 | C3 | C4 | C5 | C6 | C7 | C8 | C9 | |
|---|---|---|---|---|---|---|---|---|---|---|
| R1 | 1 | 0 | 0 | 0 | 1 | 0 | 1 | 0 | 0 | ⎫ First fractional (1/3) group of rows |
| R2 | 1 | 1 | 0 | 1 | 0 | 0 | 0 | 0 | 0 | |
| R3 | 0 | 1 | 0 | 0 | 0 | 0 | 1 | 1 | 0 | ⎭ |
| R4 | 0 | 1 | 0 | 1 | 0 | 0 | 0 | 0 | 1 | ⎫ Second fractional (1/3) group of rows |
| R5 | 0 | 0 | 1 | 0 | 0 | 0 | 0 | 1 | 0 | |
| R6 | 0 | 0 | 1 | 0 | 1 | 0 | 0 | 0 | 1 | ⎭ |
| R7 | 0 | 0 | 1 | 0 | 0 | 1 | 0 | 1 | 0 | ⎫ Third fractional (1/3) group of rows |
| R8 | 0 | 0 | 0 | 0 | 0 | 1 | 1 | 0 | 1 | |
| R9 | 1 | 0 | 0 | 1 | 0 | 1 | 0 | 0 | 0 | ⎭ |

Figure 3

| | C1 | C2 | C3 | C4 | C5 | C6 | C7 | C8 | |
|---|---|---|---|---|---|---|---|---|---|
| R1 | 0 | 1 | 0 | 1 | 1 | 0 | 0 | 1 | ⎫ First fractional (1/2) group of rows |
| R2 | 1 | 1 | 0 | 0 | 0 | 1 | 0 | 1 | |
| R3 | 0 | 1 | 0 | 0 | 0 | 1 | 1 | 0 | |
| R4 | 1 | 0 | 0 | 0 | 1 | 0 | 1 | 1 | ⎭ |
| R5 | 1 | 0 | 1 | 0 | 0 | 1 | 1 | 0 | ⎫ Second fractional (1/2) group of rows |
| R6 | 0 | 0 | 1 | 1 | 1 | 0 | 1 | 0 | |
| R7 | 1 | 0 | 1 | 1 | 0 | 0 | 0 | 1 | |
| R8 | 0 | 1 | 1 | 1 | 0 | 0 | 0 | 0 | ⎭ |

METHOD FOR TESTING SWITCH MATRICES

BACKGROUND OF THE INVENTION

1. Field of the Invention

This invention relates to a method for testing, and more particularly, to a method for testing switch matrices formed using a lesser number of switching devices than in prior art switch matrices to determine whether a particular routing path is available.

2. History of the Prior Art

Switch matrices allow combinations of signals appearing on a large number of input signal conductors to be provided at a more limited number of output conductors. Essentially, a switch matrix comprises a first set of input conductors each of which may carry a binary input value and a second set of output conductors. The input conductors may be selectively joined to the set of output conductors by switching devices. In this manner, selective combinations of a typically large number of input signals may be furnished to a smaller number of output conductors. In a full connection matrix, any one of the input conductors may be selectively joined to each of the output conductors.

Switch matrices are used for many purposes in computer and other digital systems. For example, switch matrices are an essential part of field programmable logic arrays (PLAs). Field programmable logic arrays may be used in digital systems to provide particular logic operations using binary input signals. A PLA includes a switch matrix the output conductors of which are connected to gates which allow a plurality of input values to be manipulated in accordance with various Boolean functions. By connecting the input conductors to various AND gates and the outputs of the AND gates (product terms) to various OR gates, a particular Boolean function which is the sum of the product terms produced by the AND gates may be furnished at the output of any OR gate. The Boolean output function provided at the output of each of the OR gates is programmable by a user by programing the connections to be made by the switching devices between the input conductors and the output conductors of the switch matrix using devices such as electrically programmable read only memory (EPROM) cells, fuses, or flash EEPROM cells. Normally, a switching matrix is manufactured with the switching devices in place; and a user programs the switching devices necessary to provide the proper connections for the functions the user desires. In a full connection matrix, the number of steps required to program the switching devices equals the number of output conductors so that programming is a trivial process.

Most switch matrices are full connection matrices which include physical switching devices that allow all of the input conductors to connect to all of the output conductors. The provision of switching devices at each intersection between input and output conductors causes a number of problems.

One of the problems faced by designers of switch matrices is the large amount of die area required for the actual switching devices which may make the contacts to provide the various output combinations which may be programed. In a full connection matrix where each input conductor may be connected to each output conductor, the switching devices may occupy one-quarter of the entire die area. However, with field programmable switch matrices, it has become apparent that the number of switching devices might be reduced if the appropriate connections could still be completed. Reducing the number of actual switching devices allows the die area to be reduced thereby saving expense. It also increases the speed of operation since the length of the various conductors within the matrix may be shortened.

At least two major problems arise in attempting to reduce the number of switching devices used in a switch matrix. The first problem is to determine which switching devices may be omitted by the manufacturer while still allowing a user to obtain almost all permissible combinations of signals on the input conductors at the output conductors. The second problem is to determine the particular connections which must be made by a user during programming in order to allow those switching devices which do exist to produce a particular desired output response for a given set of input signals. This programming is no longer the trivial process it is for a full connection matrix.

Each of these problems is complicated by the fact that the more advanced switching matrices tend to be quite large. For example, one recently designed matrix provides connections from 192 input conductors to 24 output conductors. With this number of conductors and many omitted switching devices, it is extremely difficult to test a significant number of combinations of input conductors to determine which are available at the output conductors. With prior art methods of testing, to test even one combination could require on the order of 241 programming steps. It has been estimated that it would take hundreds of years to complete tests for such a switch matrix using conventional computers and prior art methods of testing.

It is, therefore, desirable to provide new methods for rapidly and accurately deciding which switching devices should be omitted in reduced size switch matrices and to provide methods for ascertaining which switching devices a user should connect in such matrices in order to make particular input combinations produce desired output combinations.

SUMMARY OF THE INVENTION

It is, therefore, an object of the present invention to provide a method for testing switch matrices utilizing a reduced number of switching devices to assure that they are capable of providing almost all of the permissible connections between the input conductors and the output conductors.

It is another object of the present invention to provide a method for selecting those switching devices in a switch matrix which should be programmed in order to obtain particular output combinations from particular input combinations.

These and other objects of the present invention are realized in a testing method in which a sub-group including those particular input conductors which it is desired to connect to the output conductors are selected. Then the number of switching devices connected to each output conductor at connections with the selected input conductors are summed for each output conductor. The output conductor having the least number of switching devices at these intersections is chosen. Then the switching devices are summed for each of the selected input conductors having a switching device at an intersection with the chosen output conductor. The input conductor having the least number of switching devices is selected. A switching device at the intersection of this first selected input conductor and the first selected output conductor is chosen for closure to provide the first connection in the output combination desired.

Then a second sub-group of conductors including all of the input conductors from the first sub-group except the selected input conductor and all of the output conductors except the selected output conductor are selected. The switching devices joined to the output conductors are summed individually, and the output conductor having the least number of switching devices is selected. The switching devices joined to input conductors having switching devices at the intersections with the second chosen column are each summed. Again, the input conductor having the least number of switching devices is selected. A switching device at the intersection of this second selected input conductor and the second selected column is chosen for closure to provide the next connection for the desired output combination.

This process continues until switching devices are selected for connecting all of the input conductors of the original group of input conductors to the output conductors.

These and other objects and features of the invention will be better understood by reference to the detailed description which follows taken together with the drawings in which like elements are referred to by like designations throughout the several views.

BRIEF DESCRIPTION OF THE DRAWINGS

FIG. 3 is a diagram illustrating the connections which may be made in a half-size switch matrix.

FIG. 4 is a diagram illustrating connections which may be made in a one-third size switch matrix.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
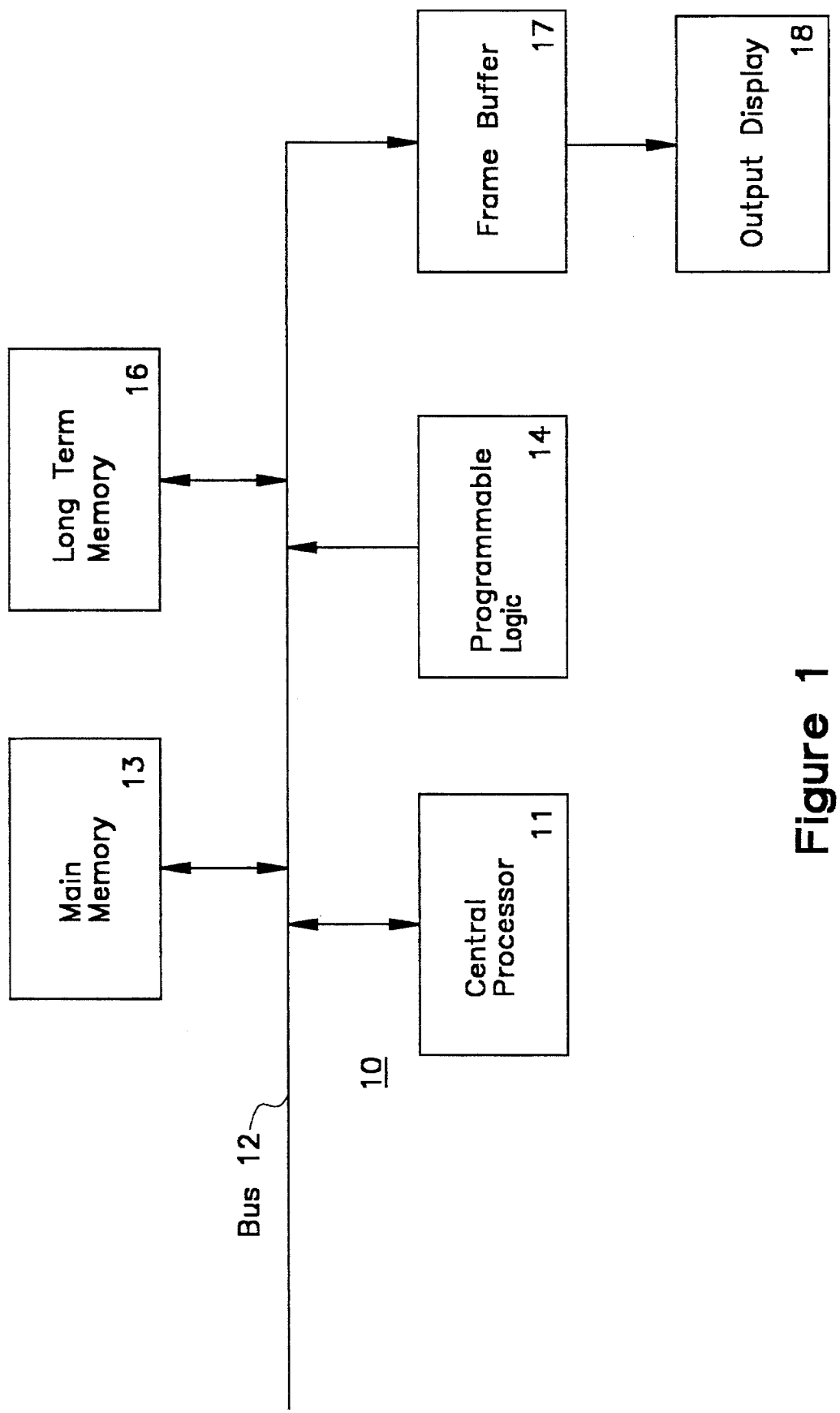
FIG. 1 is a block diagram of a computer system which may utilize the present invention.

Referring now to FIG. 1, there is illustrated a computer system 10. The system 10 includes a central processing unit 11 which executes the various instructions provided to control the operations of the computer system 10. The central processing unit 11 is joined to a bus 12 adapted to carry information to various components of the system 10. Joined to the bus 12 is main memory, 13 which is typically constructed of dynamic random access memory arranged in a manner well known to those skilled in the prior art to store information during a period in which power is provided to the system 10. Also connected to the bus 12 are various peripheral components such as long term memory 16 and circuitry such as a frame buffer 17 to which data may be written which is to be transferred to an output device such as a monitor 18 for display.

A programmable logic circuit 14 (such as a programmable logic array, a programmable array logic circuit, or a programmable logic device) constructed in a manner well known to those skilled in the art which is used to provide the logic circuitry by which various ones of the component circuits may be associated through the bus 12 with the system 10. Such circuitry is often referred to as glue logic. A programmable logic circuit may include switch matrix circuitry such as that described in this specification. Switch matrix circuitry may also be utilized in various other parts of the computer system 10 to provide a number of different functions such as instruction decoding functions associated with operations of processors utilized in various portions of the system.

Figure 2:
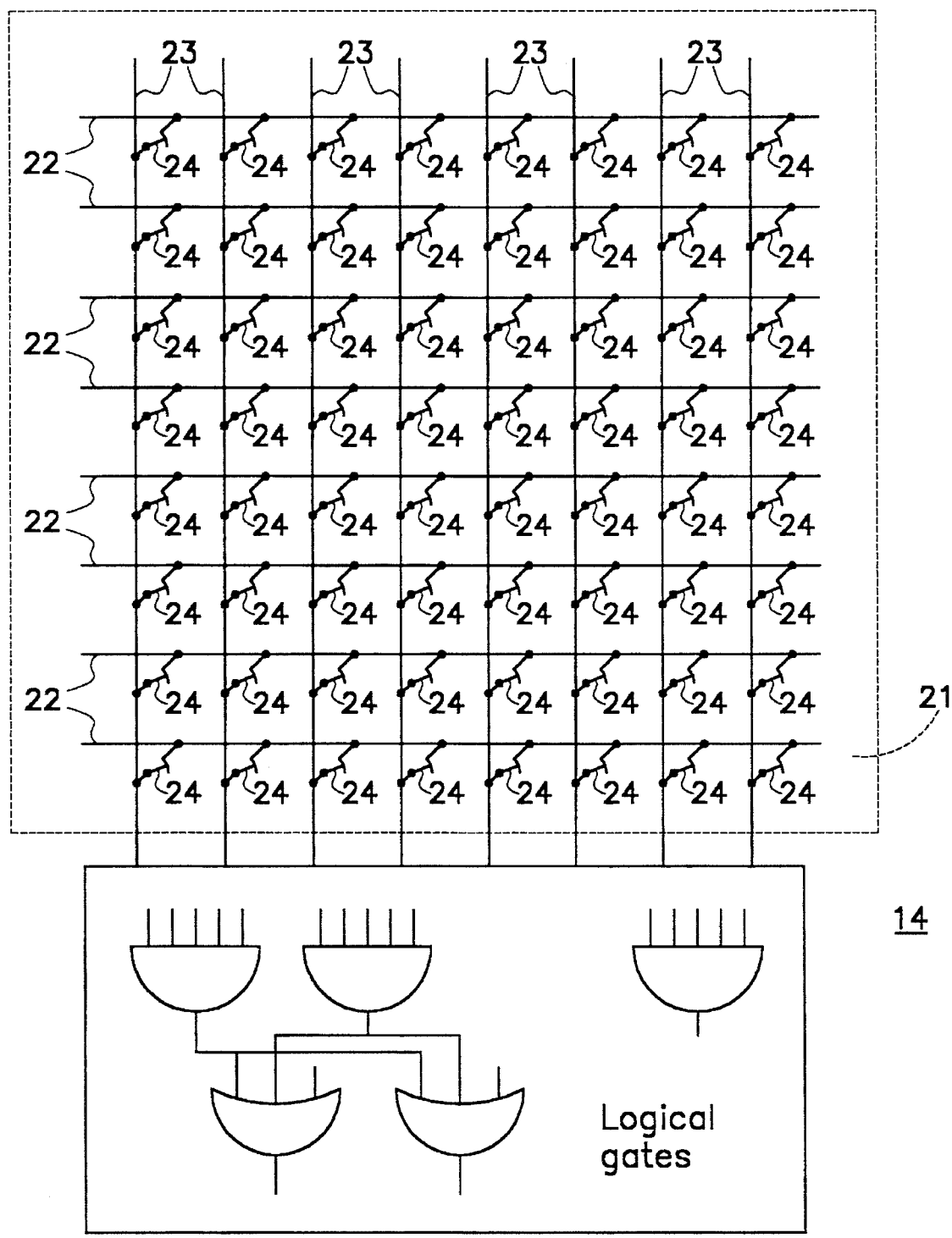
FIG. 2 is a block diagram of a conventional switch matrix of the prior art utilized in a programmable logic array.

FIG. 2 illustrates combinatorial logic in a typical field programmable logic circuit 14 which may be utilized for carrying out various operations in a computer system such as that illustrated in FIG. 1 or in other digital systems. The circuit 14 may include one or more switch matrices 21 which provide a number of output signals in response to some number of input signals. The switch matrix 21 illustrated in FIG. 2 includes input conductors 22 which may be joined to output conductors 23 by a series of switching devices 24. The input conductors 22 are typically, though not necessarily, physically arranged in rows generally at right angles to columns of output conductors 23 allowing each input conductor 22 to be adjacent to each output conductor 23 so that the switching devices 24 may be easily arranged near the intersections to make the necessary connections. Since the physical row and column arrangement is not necessary so long as the input and output conductors are connected to provide this logical arrangement, this is referred to in this specification as a logical row and column arrangement.

The switching devices 24 may be EPROM or similar memory devices which retain a condition when power is removed from the circuitry. In FIG. 2, a full connection matrix is illustrated in which a physical switch is available to connect each input conductor to each output conductor. Typically, a field programmable device sold to a user will include a full connection matrix. Such a matrix includes all of the switching devices necessary to make all of the very large number of combinations possible between the input and output conductors. The user will then program the field programmable device to carry out the particular operations the user desires by programming selected switching devices of the array to make connections which provide the desired logic functions. As pointed out, with a full connection matrix, the number of programming steps is equal to the number of output conductors from the switch matrix and is a trivial process.

It has recently been discovered that, for switch matrices greater than a certain minimum size, a random distribution of the switching devices available generally provides an almost complete set of combinations of input conductors at the output conductors where a reduction in the number of switching devices is attempted. The minimum size is essentially a size too small to provide a random pattern of switching devices. More particularly, if the number of switching devices is reduced to any fraction of the full connection size of the switch matrix, and if the number of switching devices physically available to connect all of the input conductors to all of the output conductors are placed at random throughout all of the possible intersecting positions, then almost all combinations of input signals will be available at the output conductors for that reduced size switch matrix. This may be accomplished by generating a random binary number having a length equal to the total number of possible intersections and a total of one values equal to the fraction desired multiplied by the total number of possible intersections. If the binary number is then parsed into portions equal in size to the number of output conductors, each portion of the binary number is assigned to the intersections available between one input conductor and all output conductors, and switching devices are placed at intersections indicated by one values, then a random distribution of switches will be attained. Such a random distribution will make almost all permissible combinations of input signals available at the output conductors for that reduced size switch matrix. The coverage offered by such a fractional matrix will improve as the size of the matrix increases above the minimum size described above.

The coverage offered may be improved to some extent, especially in smaller matrices, by placing some constraints upon the distribution of switching devices. As a first order constraint, if the number of switching devices connecting each of the input conductors to all of the output conductors is essentially the same for each input conductor or for each output conductor, then the coverage will be improved. This may be attained by providing a random number for each input conductor with the number of one values indicating switches equal to the fraction to which the total number of switches is reduced multiplied by the number of output conductors.

The coverage may be further improved, especially in the smaller matrices, if the number of switching devices physically available to connect any input conductor to the output conductors and any output conductor to each input conductor is equal to that same fraction of the total number of intersecting conductors and if either the switching devices available to either the input conductors or the switching devices available to the output conductors (but not both) are distributed randomly, then almost all permissible combinations of input signals will be available at the output conductors for that reduced size switch matrix.

As an example, if the number of switching devices is to be reduced to half of a full connection switch matrix, if each input conductor connects to one-half of the possible output conductors in a random pattern and each output conductor connects to one-half of the input conductors, then almost all permissible combinations of input signals will be available on the output conductors.

Since it is desirable for electronic and other reasons that every output conductor connect to the same number of input conductors and every input conductor connect to the same number of output conductors, the number of input and output conductors are selected to be divisible by the denominator of the fraction. Next, a first group of the input conductors equal in size to one over the denominator of the fraction of the total input conductors is selected. Each input conductor of this first group is provided a random distribution of switching devices by generating a random binary number for each input conductor, the random number having a number of "ones" equal to the fraction of the total number of output conductors. For example, for a switch matrix with one-half the number of switching devices, one-half the bits of the binary number for each conductor are ones. Then, for a matrix of one-half size, in the remaining half of the input conductors, each input conductor is assigned a binary number which is the complement of the binary number assigned to one of the input conductors of the first group of input conductors.

Finally, a switch is placed to connect an input conductor to an output conductor where each one appears in the binary number for that input conductor. For a switch matrix of one-half the number of switching devices, this is all that is necessary. This will cause each row of input conductors to have switching devices at one-half of the possible intersections and each column of the output conductors to similarly have switching devices at one-half of the possible intersections.

An example of such a distribution is illustrated in FIG. 3. In the figure, an eight by eight switching matrix is shown which includes rows R1–R8 of input conductors and columns C1–C8 of output conductors. Binary numbers are superimposed on these rows and columns. Each binary number includes eight bits (four ones and four zeroes), each bit positioned at an intersection of a logical column and row. If the bit is a one, a physical switching device is available for connecting the column and the row at that intersection. If the binary bit is a zero, no switch is available for that intersection. In FIG. 3, rows R1 and R5 form a matching pair so that the binary number for row R5 is the complement of the binary number for row R1. Similarly, rows R2 and R6, rows R3 and R7, and rows R4 and R8 form matching pairs with complementary binary numbers.

For smaller fractional numbers of switching devices, additional rules of arrangement apply. For a one-third switch matrix, binary numbers for the first third of the matrix input conductors are chosen in the same manner. As is shown in FIG. 4, the binary number chosen for each input conductor of the first group has one-third ones and two-thirds zeroes. For the second third of the matrix, a random number is selected for each input conductor in which the one-third of the switching devices may appear only where zeroes appear in the binary number of a selected (matching) one of the input conductors of the first third. Each input conductor of the second third is matched with an input conductor of the first third. The binary numbers for the last third are selected by providing ones in the columns where zeroes exist in both the matching row of the first third of input conductors and a matching row of the second third of input conductors. Again, a row of the first third, a row of the second third, and a row of the third third are matched to bring about this result. In the matrix illustrated in FIG. 4, rows R1, R4, and R7 are matching rows; rows R2, R5, and R8 are matching rows; and rows R3, R6, and R9 are matching rows.

It will be apparent that columns of output conductors might be randomized instead of rows of input conductors and the same type of distribution of switching devices reached.

Similarly for other fractional switch matrices in which the fraction is one over an integer, each of a first fraction of conductors (input or output) is assigned a different random binary number where each such binary number includes ones equal to the fraction of the total number of intersections which might be made in a full switch matrix. The second fractional group of conductors are assigned random binary numbers where each such number includes ones equal to the fraction of the total of intersections which might be made in a full switch matrix, but the ones are allowed only where zeroes reside for a matching one of the conductors of the first fraction of conductors. The assignment of binary numbers for each additional fractional group of conductors continues in the same manner for each of the conductors for each additional fraction of conductors placing ones only where zeroes fall in matching conductors of all of the previously chosen fractions. Finally, the binary numbers for each of the last fraction of conductors is chosen by placing ones where zeroes exist in all of the matching conductors of each of the previously chosen fractions. By this arrangement, there are an equal number of positions for each row which hold switching devices which may be closed as there are for every other row, there are an equal number of positions for each column which hold switching devices which may be closed as there are for every other column, the switching devices are randomly distributed, and the switch matrix will use only the fraction of the number of switching devices as is required by a full switch matrix yet will allow the largest number of combinations of input conductors to output conductors to be made for that fraction of switching devices.

For switch matrices in which the number of switches is some fraction other than one divided by an integer, the application becomes somewhat more complicated. For example, to construct a matrix with two-fifths the number of possible switches, the input conductors might be divided into five groups. For a first group of one fifth of the total of input conductors, random numbers might be assigned to designate switching devices at two-fifths of the possible intersections with output conductors for each input conductor of the group. Similarly, for a second group of one-fifth of the total of input conductors, random numbers might be assigned to designate switching devices at two-fifths of the possible intersections with output conductors for each input conductor of the group. For the third, fourth, and fifth groups of one-fifth of the input conductors, random numbers would be assigned to designate switching devices at two-fifths of the possible intersections for each input conductor of each group but only at intersections with an output conductors which had not yet been connected to two matching input conductors of groups previously assigned switching devices.

The embodiment which appears to offer the greatest coverage of combinations includes one-half the total of switching devices used in a full coverage switch matrix. A switch matrix may be built in the manner described which requires many fewer switching devices yet still allows the establishment of virtually all of the required combinations of connections in a shorter time than do prior art switch matrices. For example, a switch matrix having 336 input conductors and 24 output conductors constructed using the above-described arrangement provides coverage of virtually all possible combinations of 24 input signals even though only half the number of switching devices are used. For example, it has been found in testing ten million random combinations that all but seven such combinations could be found in a particular such matrix.

Figure 5:
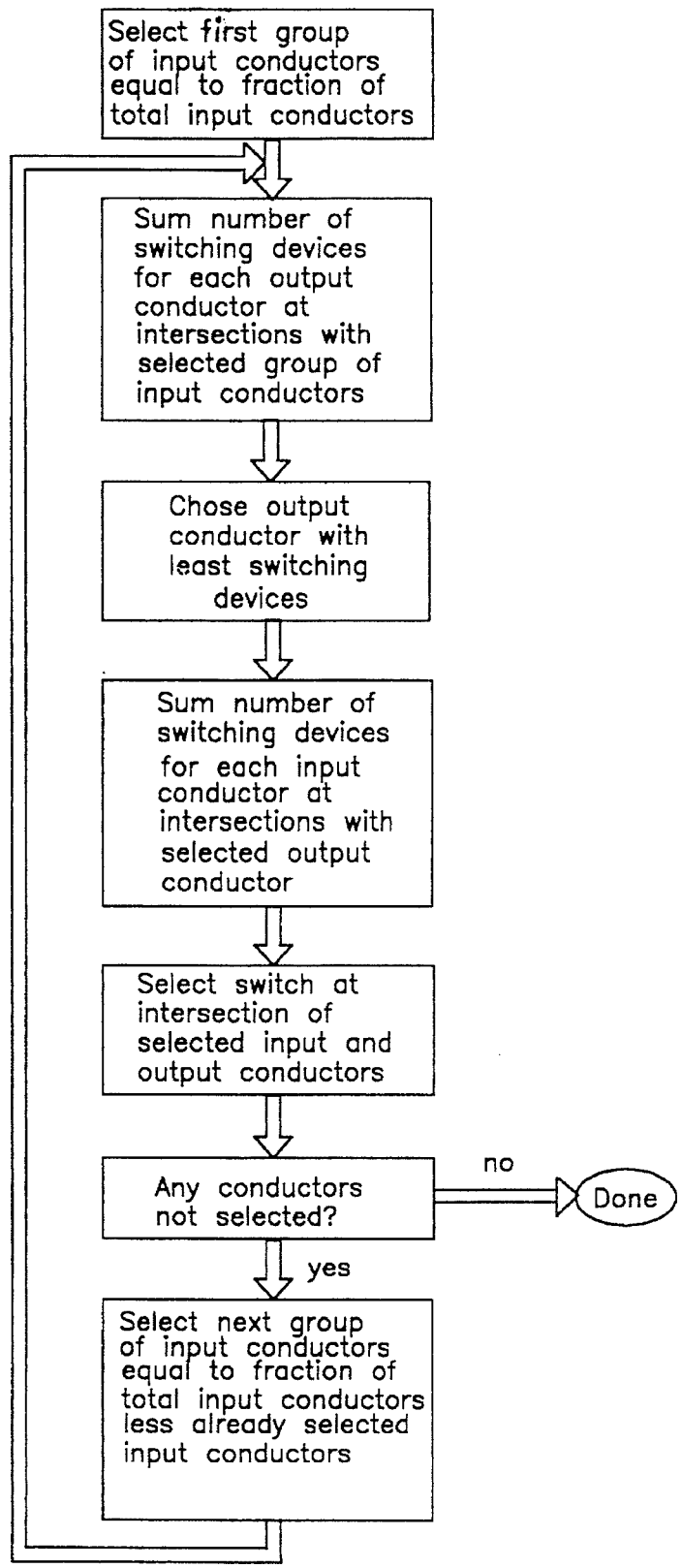
FIG. 5 is a flow chart illustrating a method of practicing the present invention.

The present invention is a rapid and accurate method for testing the patterns of any such switch matrix to assure that, even though the number of switching devices provided is limited to a fraction of the possible intersections, any particular combination and all desired combinations of input signals may in fact be connected to the output conductors. This testing method is illustrated in FIG. 5. The first step of this testing method is to select a first sub-group of input conductors which it is desired to connect to the output conductors. Then the number of switching devices connected to each output conductor and the selected input conductors are individually summed. An output conductor having the least number of switching devices at these intersections is chosen. Then the switching devices connected to input conductors of the selected sub-group having a switching device at an intersection with the chosen output conductor are individually summed. The input conductor having the least number of switching devices is selected. A switch at the intersection of this first selected input conductor and the first selected output conductor is chosen for closure to provide the first connection for the output combination desired.

Then a second sub-group of input conductors including all of the conductors except the selected input conductor and all of the output conductors except the selected output conductor are selected. The switching devices connected to those output conductors are summed individually, and the output conductor having the least number of switching devices is selected. The switching devices connected to input conductors having switching devices at the intersections with the second chosen output conductor are each summed. Again, the input conductor having the least number of switching devices is selected. A switch at the intersection of this second selected input conductor and the second selected output conductor is chosen for closure to provide the next connection for the output combination desired.

This process continues until switching devices for connecting all of the input conductors and output conductors of the original group of input conductors are selected. If at any point in the selection either an input conductor or an output conductor has no switching devices remaining, then that connection cannot be made and the particular switch matrix fails for that combination. After the switching devices are selected for one combination of input conductors, additional combinations are tested until all desired combinations have been tested. In this manner a matrix design may be checked for coverage before manufacture or a matrix which has been manufactured may be tested to determine which switching devices to close for particular combinations.

It should be noted that this testing method selects combinations of input and output conductors to connect beginning with the input and output conductor providing the least possible number of combinations. The testing method continues selecting the two input and output conductors at each step which provide the least possible number of combinations. By doing this, those combinations which include the greatest number of possibilities are always left for the more difficult later connections. In this manner the switch matrix chosen may be tested to determine if the most possible combinations are available.

The present testing method may be implemented using a computer by utilizing the binary ones and zeroes described above to described switching devices at intersections and the lack thereof. As described, those rows of input conductors which it is desired to connect to the columns of output conductors are selected. Then the number of ones representing switching devices in each column at connections with these input conductors are summed. The column having the least number of ones at these intersections is chosen. If more than one column has the same least number, any such column may be selected. Then the ones are summed in each of the selected input rows having a one at an intersection with the chosen column. The row having the least number of ones is selected. If more than one row has the same least number, any such row may be selected. The switch at the intersection of this first selected row and the first selected column is chosen for closure as a first step in providing the output combination desired. Then a smaller sub-matrix of rows including all of the input rows except the selected row and all of the columns except the selected column is selected. The ones in those columns are summed individually by columns, and the column having the least number of ones is selected. The ones in rows of this sub-matrix having ones at the intersections with the second chosen column are each summed. Again, the row having the least number of ones is selected. A switch at the intersection of this second selected row and the second selected column is chosen for closure as a next step in providing the output combination desired.

This process continues until switching devices for connecting all of the rows and columns of the original group of input conductors are selected. If at any point in the selection process, no column has any ones remaining and there are still input conductors in the original combination which are not connected to an output conductor, then that connection cannot be made and the particular switch matrix fails for that combination. The process requires on the order of $N^2$ steps instead of the N! steps required by prior art process where N is the number of output conductors. This allows the testing of a particular combination in a matter of a fraction of a second as opposed to hundreds of years with prior art processes. Using this testing method, it has been found that a best matrix may be selected for manufacture rapidly. The present method for testing a switch matrix of 192 by 24, for example, may be completed in seconds. Thus, it becomes feasible to run millions of tests on a particular switch matrix to determine one which has the best possible coverage.

The present method may be used both to test a proposed switch matrix prior to actual manufacture of the integrated circuit chip or by a user after manufacture to establish those connections which should be made in an existing programmable switch matrix. In the former case, a large number of combinations may be tested and the matrix with the least failures selected for manufacture. In the latter case, the computer program may include a last step in which after each step of the selection a switching device is actually programmed to accomplish the closure.

Moreover, an additional step may be included after each selection of the conductor having the least number of switching devices in which the combination of input conductors is failed if no switching device exists.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A testing method for determining switching devices to close in a switch matrix having a plurality of input conductors and a plurality of output conductors arranged as logical rows and columns which intersect and having switching devices at a fraction of intersections comprising the steps of:

(step 1) selecting a combination of input conductors to be connected to the output conductors, (step 2) summing the number of switching devices connected to each output conductor at intersections with the combination of input conductors, (step 3) selecting an output conductor having a least number of switching devices at intersections with the combination of input conductors, (step 4) summing the switching devices for each of the combination of input conductors having a switching device at an intersection with the selected output conductor, (step 5) selecting an input conductor having the least number of switching devices, (step 6) selecting a next combination of input conductors including all of the input conductors from the first combination except a previously selected input conductor arid all of the output conductors except a previously selected output conductor, and (step 7) repeating each of the steps 2 through 6 until no conductors remain which have not been selected.

2. A testing method as claimed in claim 1 further including the step of repeating each step for each combination of input conductors to be connected to the output conductors.

3. A testing method as claimed in claim 1 further including after step 5 the step of closing a switching device at the intersection of a selected input conductor and a selected output conductor to provide a connection.

4. A testing method as claimed in claim 3 further including the step of repeating each step for each combination of input conductors to be connected to the output conductors.

5. A testing method as claimed in claim 1 further including the steps of:

after step 3, failing the combination of input conductors if no output conductor has a switching device at an intersection with the combination of input conductors, and after step 5, failing the combination of input conductors if no input conductor has a switching device at an intersection with the selected output conductor.

6. A testing method for determining switching devices to close in a switch matrix having a first plurality of conductors and a second plurality of conductors arranged as logical rows and columns which intersect with switching devices at a fraction of intersections comprising the steps of:

(step 1) selecting a combination from the first plurality of conductors to be connected to the second plurality of conductors, (step 2) summing the number of switching devices connected to each of the second plurality of conductors at intersections with the combination from the first plurality of conductors, (step 3) selecting the conductor from the second plurality of conductors having the least number of switching devices at intersections with the combination from the first plurality of conductors, (step 4) summing the switching devices for each of the combination from the first plurality of conductors having a switching device at an intersection with the selected conductor from the second plurality of conductors, (step 5) selecting the conductor from the first plurality of conductors having the least number of switching devices, (step 6) selecting a next combination of conductors from the first plurality of including all of the conductors from the first combination from the first plurality of conductors except a previously selected conductor from the first plurality of conductors and all of the conductors from the second plurality of conductors except a previously selected conductor from the second plurality of conductors, and (step 7) repeating each of the steps 2 through 8 until no conductors remain which have not been selected.

7. A testing method as claimed in claim 6 further including the step of repeating each step for each combination of conductors from the first plurality of conductors to be connected to the second plurality of conductors.

8. A testing method as claimed in claim 6 further including after step 5 the step of closing a switching device at the intersection of a selected conductor from the first plurality of conductors and a selected conductor from the second plurality of conductors to provide a connection.

9. A testing method as claimed in claim 8 further including the step of repeating each step for each combination of conductors from the first plurality of conductors to be connected to the second plurality of conductors.

10. A testing method as claimed in claim 6 further including the steps of:

after step 3, failing the combination of conductors from the first plurality of conductors if no conductor from the second plurality of conductors has a switching device at an intersection with the combination of conductors from the first plurality of conductors, and after step 5, failing the combination of conductors from the first plurality of conductors if no conductor from the first plurality of conductors has a switching device at an intersection with the selected conductor from the second plurality of conductors.

* * * * *

UNITED STATES PATENT AND TRADEMARK OFFICE
CERTIFICATE OF CORRECTION

| | | |
|---|---|---|
| PATENT NO. | : | 5,486,766 |
| DATED | : | January 23, 1996 |
| INVENTOR(S) | : | Hibdon et al. |

It is certified that error appears in the above-identified patent and that said Letters Patent is hereby corrected as shown below:

In column 1 at line 41 delete "programing" and insert --programming--

In column 1 at line 60 delete "programed." and insert --programmed.--

Signed and Sealed this

Twenty-eighth Day of January, 1997

Attest:

BRUCE LEHMAN

*Attesting Officer*  *Commissioner of Patents and Trademarks*